United States Patent
El-Mansouri et al.

(10) Patent No.: US 10,699,755 B2
(45) Date of Patent: Jun. 30, 2020

(54) APPARATUSES AND METHODS FOR PLATE COUPLED SENSE AMPLIFIERS

(71) Applicant: MICRON TECHNOLOGY, INC., Boise, ID (US)

(72) Inventors: Adam S. El-Mansouri, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/134,732

(22) Filed: Sep. 18, 2018

(65) Prior Publication Data

US 2020/0090709 A1 Mar. 19, 2020

(51) Int. Cl.
| G11C 7/06 | (2006.01) |
| G11C 11/22 | (2006.01) |
| G11C 5/14 | (2006.01) |
| G11C 7/22 | (2006.01) |

(52) U.S. Cl.
CPC .............. G11C 7/065 (2013.01); G11C 5/147 (2013.01); G11C 7/222 (2013.01); G11C 11/2273 (2013.01); G11C 11/2293 (2013.01); G11C 11/2297 (2013.01)

(58) Field of Classification Search
CPC .................................. G11C 7/065; G11C 5/147
USPC .................................................... 365/189.15
See application file for complete search history.

(56) References Cited

U.S. PATENT DOCUMENTS

| 6,002,618 A * | 12/1999 | Komarek | G11C 7/1051 365/189.05 |
| 6,335,893 B1 * | 1/2002 | Tanaka | G11C 5/145 365/226 |
| 7,869,289 B2 * | 1/2011 | Fujishiro | G11C 7/1051 365/185.09 |
| 8,289,755 B1 * | 10/2012 | Rahim | G11C 11/4125 365/154 |
| 8,624,632 B2 * | 1/2014 | Bulzacchelli | H03K 3/356139 327/212 |
| 10,175,271 B2 * | 1/2019 | Thomsen | G01R 17/02 |
| 2004/0042276 A1 * | 3/2004 | McElroy | G11C 7/065 365/189.09 |
| 2011/0096616 A1 * | 4/2011 | Kubouchi | G11C 7/065 365/207 |

* cited by examiner

*Primary Examiner* — Hoai V Ho
*Assistant Examiner* — Muna A Techane
(74) *Attorney, Agent, or Firm* — Dorsey & Whitney LLP

(57) ABSTRACT

Embodiments of the disclosure are drawn to apparatuses and methods for plate coupled sense amplifiers. An example embodiment may include a sense amplifier which may sense a voltage from a memory cell. The sense amplifier may also monitor a change in the voltage, and determine a logical value of the memory cell based on the time when the voltage reaches a trigger voltage. The memory cell may be coupled to a plate with a plate voltage, wherein a change in the plate voltage determines the change of the voltage from the memory cell.

7 Claims, 11 Drawing Sheets

APPARATUSES AND METHODS FOR PLATE COUPLED SENSE AMPLIFIERS

BACKGROUND

This disclosure relates generally to semiconductor devices, and more specifically to semiconductor memory devices. The memory device may hold a number of physical signals (e.g., a charge, voltage, polarization, etc.) each corresponding to a logical value. There may be a small difference between the physical signal representing a 'high' logical value and the physical signal representing a 'low' logical value. It may be desirable to amplify the physical signals of the memory cells into logical signals (e.g., voltages) which can be more easily used by other components of the semiconductor device and may have a more easily distinguishable difference between 'high' and 'low' logical states.

The memory device may include a memory cell array including a number of word lines (rows) and bit lines (digit lines, columns). Memory cells each containing data (e.g., a bit of data) are disposed at each intersection of word lines and bit lines. The data may be stored in each memory cell as a physical signal which, when accessed results in an electrical signal representing one or more logical values. The logical values may be binary values used in computing systems (e.g., '1' and '0', 'true' and 'false', 'high' and 'low', etc.).

Sense amplifiers may be coupled to the memory cells (e.g., coupled to bit lines to which accessed memory cells are coupled) to convert and/or amplify the signals of selected memory cells during a read operation. For example, the sense amplifier may sense the signal from the memory cell and may also increase the voltage difference a 'high' logical value and a low 'logical' value. The sense amplifier may be a high power component of the memory and/or may have difficulty sensing small differences between the signals representing the different logical values. It may be desirable to reduce the complexity and/or power requirements of the sense amplifiers.

DETAILED DESCRIPTION

Figure 1:
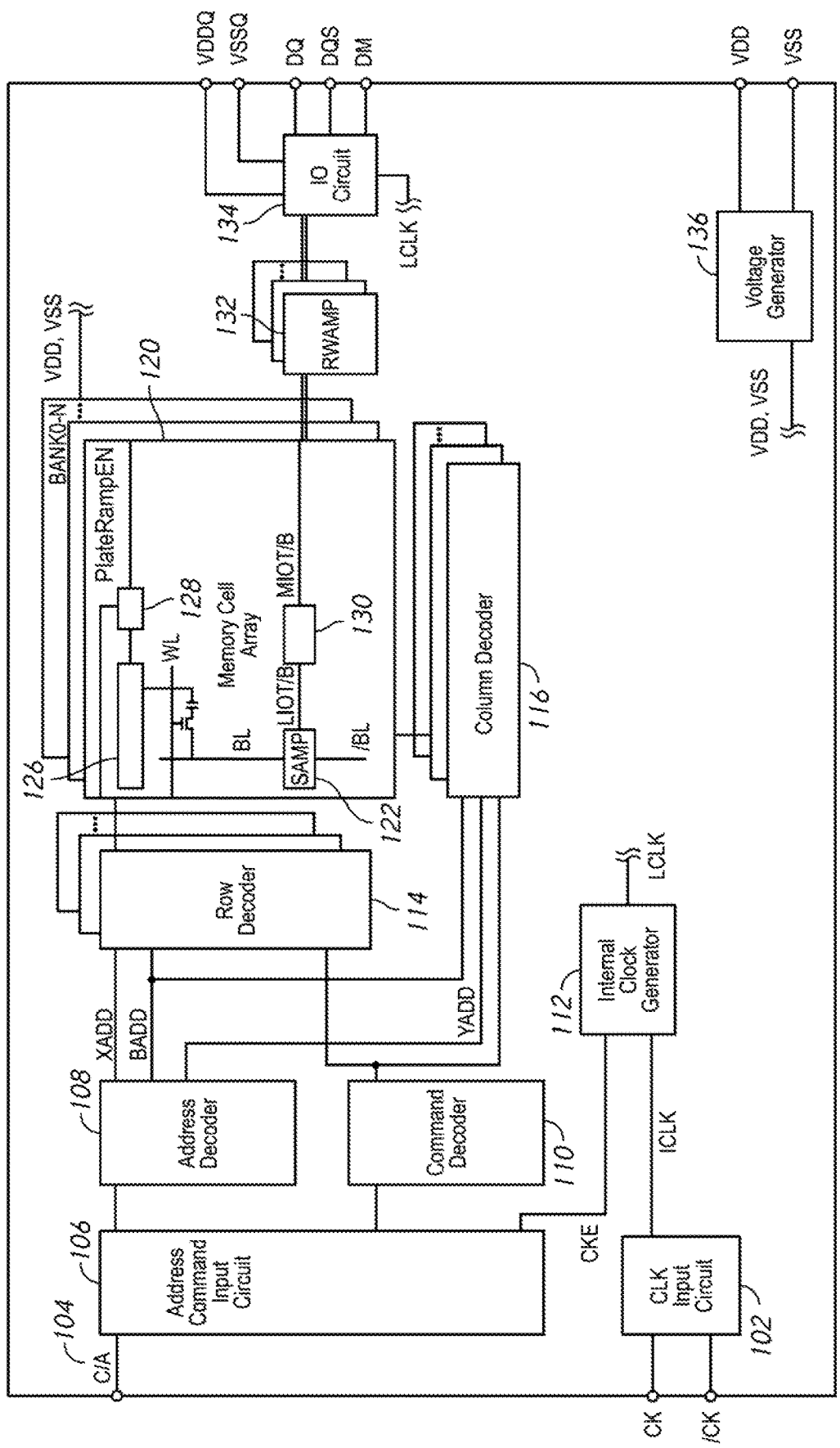
FIG. 1 is a block diagram of a semiconductor device according to an embodiment of the present disclosure.

The following description of certain embodiments is merely exemplary in nature and is in no way intended to limit the invention or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

The present disclosure is directed to apparatuses and methods for coupling a sense amplifier to a plate of the memory. The plate may be a common connection between different bit lines of the memory and may have a voltage that can be gradually changed from a first voltage to a second voltage. The first and second voltages may be limit voltages of the system (e.g., a ground voltage and a positive power supply voltage). The sense amplifier may sense a signal from a memory cell as a voltage and that read voltage may change at a rate linked to the rate that the plate voltage is changed. The logical value of the memory cell may be determined based on the time at which the read voltage reaches a trigger voltage compared to the time at which a reference voltage corresponding to a known logical value reaches the trigger voltage. The trigger voltage may be an input voltage at which an output voltage of the sense amplifier changes. The sense amplifier may output a signal based on the determined logical value. By coupling the amplification to the ramping of the plate voltage, the embodiments of the disclosure may provide one or more benefits, such as a low power or low voltage operation, an increased sense window, a tunable resolution of the sense window, a full threshold offset cancelation, a more sensitive detection of differences in charge on the memory cell, and/or less control signals than conventional designs.

FIG. 1 is a block diagram of a semiconductor device according to at least one embodiment of the disclosure. The semiconductor device 100 may be a semiconductor memory device, which in some embodiments may be a ferroelectric random-access memory (FeRAM). The semiconductor device 100 may include a clock input circuit 102, an internal clock generator 112, an address command input circuit 106, an address decoder 108, a command decoder 110, a plurality of row (e.g., word line) decoders 114, a plurality of column (e.g., bit line) decoders 116, a memory cell array 120, a plurality of read/write amplifiers 132, an input/output (I/O) circuit 134, and a voltage generator 136. The memory cell array 120 may include multiple banks, each of the banks containing a plurality of sense amplifiers 122, latches 130 coupled to the sense amplifiers, word lines (WL) and bit lines (BL), and a plate 126, and ramp control circuit 128. The semiconductor device 100 may include a plurality of external terminals including address and command terminals coupled to command/address bus 104, clock terminals CK and /CK, data terminals DQ, DQS, and DM, and power supply terminals VDD, VSS, VDDQ, and VSSQ. The terminals and signal lines associated with the command/address bus 104 may include a first set of terminals and signal lines that are configured to receive the command signals and a separate, second set of terminals and signal lines that configured to receive the address signals, in some examples. In other examples, the terminals and signal lines associated with the command and address bus 104 may include common terminals and signal lines that are configured to receive both command signal and address signals. The semiconductor device may be mounted on a substrate, for example, a memory module substrate, a mother board or the like.

The memory cell array 120 includes a plurality of banks BANK0-N, where N is a positive integer, such as 3, 7, 15, 31, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 114 and the selection of the bit line BL is performed by a corresponding column decoder 116. The unselected bit lines BL of a bank may be coupled to the plate 126 through one or more switches. The coupling of the unselected bit lines BL may prevent disturbances on the unselected BL's. The memory cells MC may be coupled directly to the plate 126. The plate 126 may have a plate voltage which may be controlled by a ramp control circuit 128. The ramp control circuit 128 may receive external limit voltages (e.g., VDD and VSS from the voltage generator 136) and may vary the plate voltage between these limit voltages over time. The ramp control circuit 128 may also receive one or more control signals to determine, for example, when and at what rate to change the plate voltage, and/or may operate with internal logic. For example, the row decoder 114 may provide an enable signal PlateRampEn, which may activate the ramp1 control circuit 128. Each of the unselected bit lines BL may be coupled to the plate 120 such that a voltage of each coupled bit line BL changes in time when the plate voltage changes in time.

Each selected bit line BL (or, in some embodiments, each group of bit lines BL) is coupled to a sense amplifier 122. During a read operation of the memory 100, the sense amplifier 122 retrieves data along the bit line BL from a memory cell MC along an activated word line WL. The sense amplifier 122 may retrieve the data from the memory cell by reading the data as a voltage corresponding to a logical value of the original data. The sense amplifier 122 may amplify a magnitude of the read voltage and/or convert the read voltage into a voltage usable by other components of the memory device 100. The sense amplifier 122 provides the amplified signal to a latch circuit 130, which may save the amplified signal as an output in response to a timing signal. The latch circuit 130 may provide the output signal as the logical value read from the memory cell MC.

The address/command input circuit 106 may receive an address signal and a bank address signal from outside at the command/address terminals via the command/address bus 104 and transmit the address signal and the bank address signal to the address decoder 108. The address decoder 108 may decode the address signal received from the address/command input circuit 106 and provide a row address signal XADD to the row decoder 114, and a column address signal YADD to the column decoder 116. The address decoder 108 may also receive the bank address signal and provide the bank address signal BADD to the row decoder 114 and the column decoder 116.

The address/command input circuit 106 may receive a command signal from outside, such as, for example, a memory controller at the command/address terminals via the command/address bus 104 and provide the command signal to the command decoder 110. The command decoder 110 may decode the command signal and provide various internal command signals. For example, the internal command signals provided to sense amplifiers control the sense amplifiers during access operations (e.g., read, open, write, etc.). The internal command signals may include a row command signal to select a word line, a column command signal, such as a read command or a write command, to select a bit line.

Accordingly, when a read command is issued and a row address and a column address are timely supplied with the read command, data is read from a memory cell in the memory cell array 120 designated by the row address and the column address. The read/write amplifiers 132 may receive the read data and provide the read data to the IO circuit 134. The IO circuit 134 may provide the read data to outside via the data terminals DQ together with a data strobe signal via the DQS terminal and a data mask signal via the DM terminal. Similarly, when the write command is issued and a row address and a column address are timely supplied with the write command, and then the input/output circuit 134 may receive write data at the data terminals DQ, together with a data strobe signal at DQS, and a data mask signal at DM, and provide the write data via the read/write amplifiers 132 to the memory cell array 120. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 102. The clock input circuit 102 may receive the external clock signals and generate an internal clock signal ICLK. The clock input circuit 102 may provide the internal clock signal ICLK to an internal clock generator 112. The internal clock generator 112 may generate a phase controlled internal clock signal LCLK based on the received internal clock signal ICLK and a clock enable signal CKE from the address/command input circuit 106. Although not limited thereto, a DLL circuit may be used as the internal clock generator 112.

The internal clock generator 112 may provide the phase controlled internal clock signal LCLK to the IO circuit 134. The IO circuit 134 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 136. The voltage generator circuit 136 may generate various internal voltages based on the power supply voltages VDD and VSS. In some examples, the voltage generator 136 may condition the power supply voltages VDD and VSS and pass them on to various circuit components as an internal voltage. The power supply voltages VDD and VSS may be coupled to the memory cell array 120 and distributed to one or more of the ramp control circuit 128 and the sense amplifiers 122. In some examples the power supply voltage VSS may be used as a ground voltage of the circuit. In some examples, the power supply voltage VDD may be used as a signal representing a logical 'high' value (e.g., '1') and the power supply voltage VSS may be used as a signal representing a logical 'low' value (e.g., '0') for data output from the memory cell array 122 during a read command.

Figure 2:
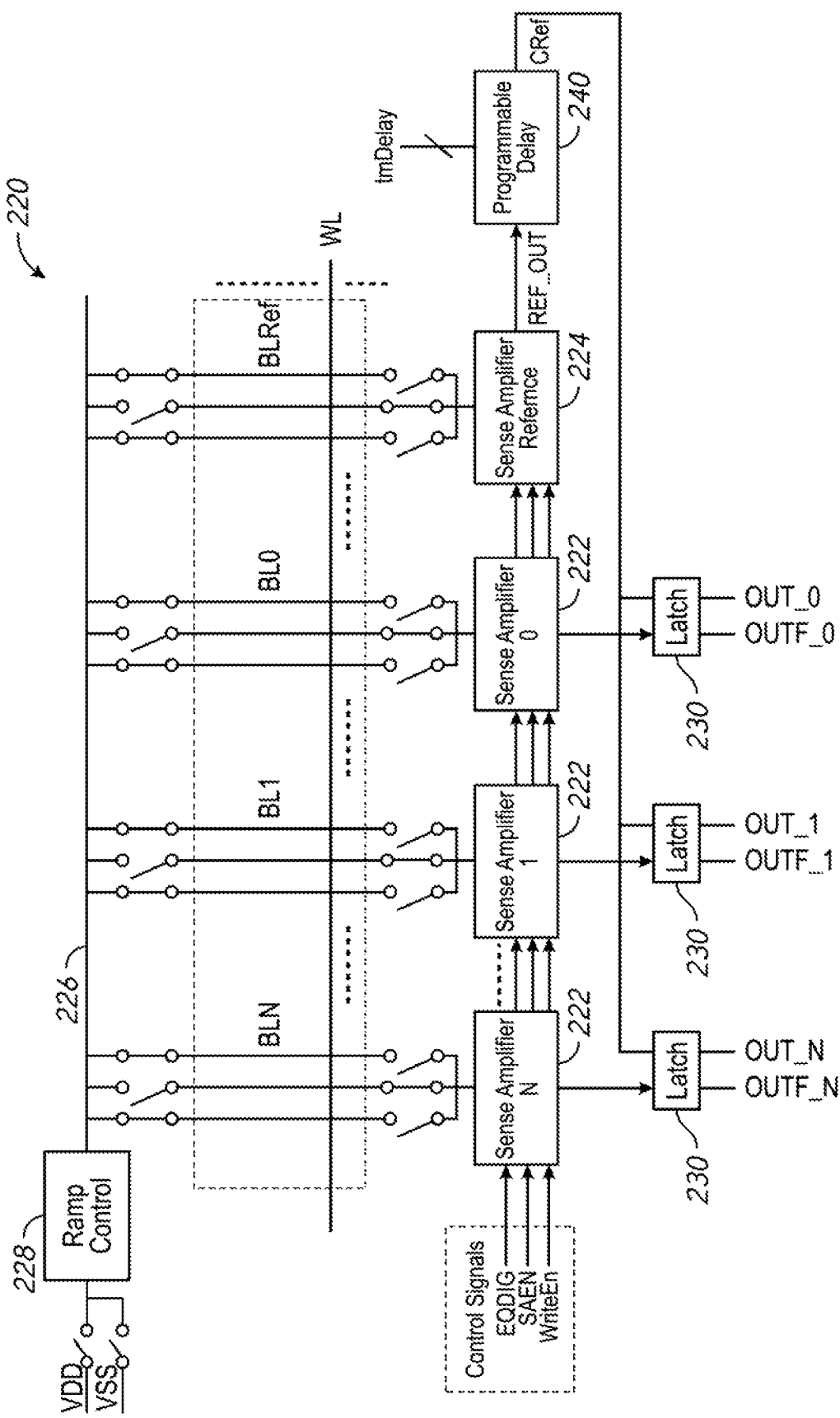
FIG. 2 is a block diagram of a memory bank according to an embodiment of the present disclosure.

FIG. 2 is a block diagram of a memory bank according to an embodiment of the present disclosure. FIG. 2 depicts a simplified view of a memory cell array 220, which, in some embodiments, may be an implementation of the memory cell array 120 of FIG. 1.

The memory cell array 220 may include a plurality of bit lines (BL0 to BLN) and a plurality of word lines WL. For clarity, only a single word line and a single bank of the memory cell array 220 are shown in FIG. 2. Memory cells may be located at the intersection of each bit line and each word line. The unselected bit lines may each be coupled to the plate 226. The selected bit lines may each be coupled to a respective sense amplifier 222, or groups of bit lines may share a sense amplifier 222. As shown, each sense amplifier 222 is selectively coupled to a single bit lines. The unselected bit lines may be coupled to the plate 226 via one or more switches. The selected bit line couples to the sense amplifier 222 via switches. However, some embodiments of the disclosure may include greater or fewer numbers of bit lines sharing a sense amplifier. The switches may be used in the case where multiple bit lines are coupled to each sense amplifier 222 to select a bit line to be sensed by the sense amplifier 222.

The plate 226 may be a plate contact bus having a plate voltage. The plate 226 may be coupled to the memory cell 220. The plate 226 may be coupled to a ramp control circuit 228 which determines the plate voltage. The ramp control circuit 228 may be coupled to voltages from a power supply (e.g., via voltage generator 136 of FIG. 1). The voltages may include a power supply voltage VDD and a ground voltage VSS. The ramp control circuit 228 may select one of these voltages to set as the plate voltage. The ramp control 228 may control a rate at which the plate voltage changes from a current voltage to the selected voltage. In some embodiments of the disclosure, the ramp control 228 may 'ramp' the plate voltage by changing it in a linear fashion from the current voltage to the selected voltage.

As described herein, during a read operation, each sense amplifier 222 may sense a voltage of a respective bit line, determine a logical value of the voltage, and provide an output voltage based on the determined logical value. The sense amplifier 222 may convert the voltages of the bit lines into output voltages which may be used by other components of a semiconductor device. For example, the difference in voltages between a first logic value and a second logic value may be small on the bit line. The sense amplifier may produce output voltages for the first logic value and the second logic value that have a large difference between them. The sense amplifier 222 provides the output voltages to a respective latch circuit 230, where they are latched as outputs to be provided to other components (e.g., read/write amplifier 132 of FIG. 1).

The memory cell array 220 also includes a reference bit line (BLRef) which has a reference memory cell which stores data with a known logical value. The reference bit line BLRef is coupled to a reference sense amplifier 224. The reference sense amplifier 224 may operate in a similar manner to the sense amplifiers 222 to sense a voltage along the reference bit line BLRef and amplify it to a reference output voltage REF_OUT. The reference sense amplifier 224 may provide the output reference voltage REF_OUT to a programmable delay circuit 240.

The sense amplifiers 222 and the reference sense amplifier 224 may be provided control signals including a digit equalization signal EQDIG, a sense amplifier enable signal SAEN, and a write enable signal WriteEn. The control signals may be provided by a command decoder, for example, the command decoder 110 of FIG. 1. The control signals, together with activating the bit lines BL and word lines WL may be used to operate the sense amplifiers 222 and reference amplifier 224. Although not used in the read operations described below, the write enable signal WriteEn may be used in a 'write-back' operation, where the same logical value is written back to the memory cell.

The programmable delay circuit 240 receives the output reference voltage REF_OUT from the reference sense amplifier 240 and provides it as the delayed reference signal CRef after a configurable time delay. The programmable delay circuit 240 may receive a time delay adjustment signal tmDelay. The time delay adjustment signal tmDelay may be based, at least in part, on the operation of the ramp control circuit 228. In some examples, the ramp control circuit 228 may produce the time delay adjustment signal tmDelay based on the rate at which the ramp control circuit 228 is changing the plate voltage. In other examples, the ramp control circuit 228 and the programmable delay 240 may both receive a command signal which specifies a ramp rate of the plate voltage, and the programmable delay 240 may generate the time delay adjustment signal tmDelay based on this rate.

The delayed reference signal CRef is provided to the latch circuits 230. There may be a latch circuit 230 for each of the sense amplifiers 222. The latch circuits 230 may 'latch' or save a value of the output voltage from the sense amplifiers 222 when the latch circuits 230 are activated by the delayed reference signal CRef (e.g., activated when the delayed reference signal CRef becomes active, such as transitioning to a logic high state).

As previously described, the voltages of the bit lines BL0-BLN and the reference bit line BLRef may be coupled to the cells, while the cells are coupled to the plate and as the plate 226 is ramped from a first voltage to a second voltage (e.g., between two limit voltages), voltages on the bit lines and reference bit lines may also change. When the reference sense amplifier's 224 output reaches a trigger voltage as it changes with the voltage on the plate 226, the programmable delay provides an activation of the delayed signal CRef. Since the reference sense amplifier 224 was coupled to a reference bit line BLRef with a known logical value, the activation of the delayed signal CRef may be used as a cutoff time. The latch circuits 230 may record the output of any sense amplifier 222 that reaches the trigger voltage at or before the cutoff time as having the same logical value as the reference bit line BLRef, while any circuits which have are still above the trigger voltage at or before the cutoff time may have the opposite logical value as the reference bit line BLRef. Accordingly, since a change in the voltage of the bit lines is coupled to a change in the voltage of the plate 226, the rate at which the plate voltage is changed may determine a length of the time window between high and low logic values reaching a trigger voltage of the sense amplifier. Similarly, the time delay adjustment signal tmDelay may be used to tune or adjust the sensing time within the time window.

Figures 3A, 3B:
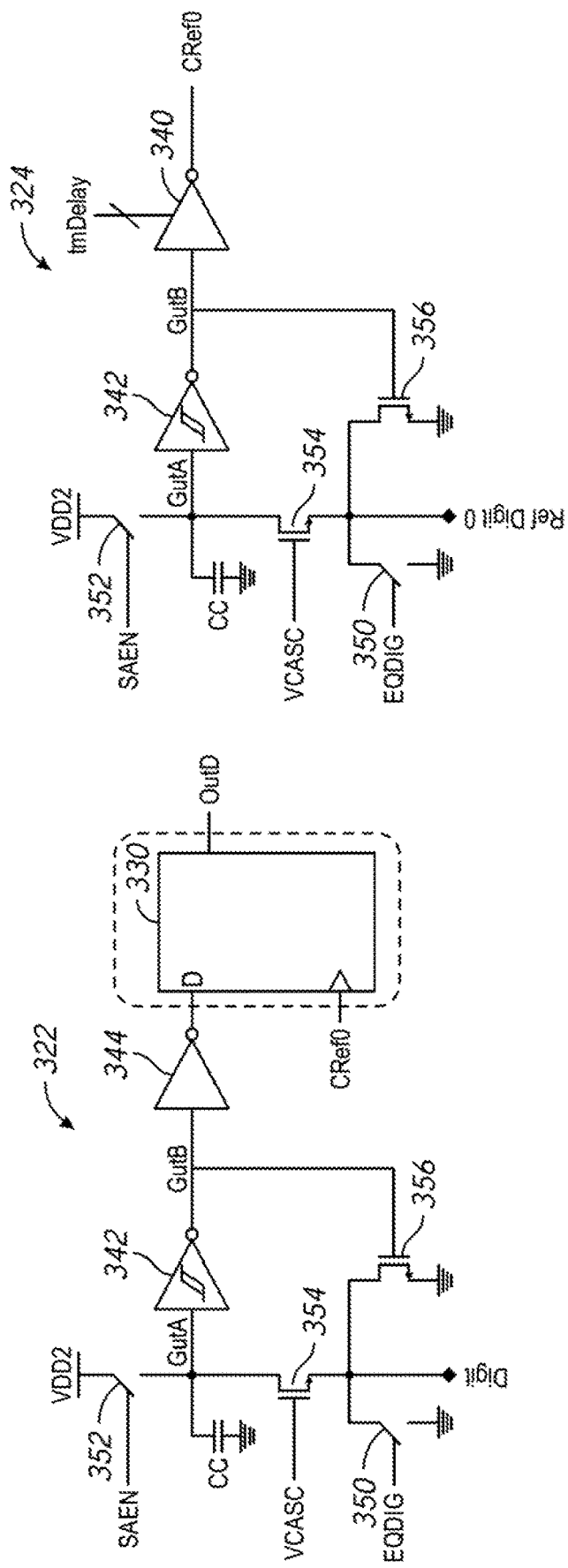
FIGS. 3A-3B are block diagrams of a sense amplifier and reference amplifier, respectively, according to an embodiment of the present disclosure.

FIGS. 3A-3B are block diagrams of a sense amplifier and reference amplifier, respectively, according to some embodiments of the present disclosure. In some embodiments, the sense amplifiers 322 may be used as the sense amplifier 222 of FIG. 2 and the reference sense amplifiers 324 of FIG. 3B may be used as the reference sense amplifier 224 of FIG. 2. The sense amplifiers 322 and the reference sense amplifiers 324 may have similar components, except that the sense amplifier 322 is coupled to a latch circuit 330 and a bit line (via the input line Digit), while the reference sense amplifier 324 is coupled to a reference bit line (via the input line Ref Digit 0) and to a time delay circuit 340.

The amplifiers of FIG. 3A-3B are schematic representations of a sense amplifier used when the plate connected to the bit line (e.g., plate 226 of FIG. 2) changes from a low to a high voltage. In particular, the circuits of FIG. 3A-3B operate based on the plate being initially at a power supply voltage (e.g., VDD) and then changing to a ground voltage. Since the sense amplifier 322 share a similar structure and function to the reference sense amplifier 324, in the interest of brevity operation will be described with respect to the sense amplifiers 322. However, it is to be understood that similar components and connections may be used in the reference sense amplifier 324.

FIG. 3A shows a sense amplifier 322 which receives command signals sense enable (SAEN), digit equalize EQDIG, and a bias voltage VCASC. The sense amplifier 322 includes a hysteresis inverter 342 and an inverter 344. A first gut node (GutA) is positioned at an input of the hysteresis inverter 342, while a second gut node (GutB) is positioned at an output of the hysteresis inverter 342. The hysteresis inverter 342 may be activated by a voltage provided by GutA to change the voltage provided on GutB. For example, when the voltage on GutA increases above a rising trigger voltage, the hysteresis inverter 342 may be activated to provide a low voltage to GutB. If the voltage on GutA falls below a falling trigger voltage, the hysteresis inverter 342 may be activated to provide a high voltage to GutB. The rising trigger voltage and the falling trigger voltage may be different values from each other, and may depend on the configuration of the hysteresis inverter 342.

The sense amplifier 322 has an input line (Digit) which is selectively coupled to a memory cell via a bit line when the memory cell is accessed (e.g., read). The input line Digit is also selectively coupled to a ground via a digit initialization switch 350 which is activated by the digit equalization signal EQDIG. The first gut node GutA is coupled to ground via a gut node capacitor CC and selectively coupled to power supply voltage VDD via a gut node initialization switch 352 activated by the sense amplifier enable signal SAEN. The first gut node and the input line Digit are coupled by a transistor 354 with a fixed bias voltage VCASC. A feedback transistor 356 selectively couples the input line Digit to ground when activated by the voltage on the second gut node GutB The digit equalize signal EQDIG may activate the digit initialization switch 350 to selectively couple the input line Digit to ground. This may initialize the input line Digit to a ground voltage. The digit equalize signal EQDIG may be used before the word line is activated to equalize all of the input lines of various sense amplifiers 322 to the same voltage (e.g., ground). Once equalized to ground, the digit equalize signal EQDIG is deactivated and the input line Digit is no longer coupled to the ground voltage. In this manner, any differences in voltage on the input lines Digit will be due to the voltage of the memory cell when the input line Digit is later coupled to the bit line.

Before the sense amplifier 322 begins to amplify signals from the memory cell, the sense amplifier 322 may undergo a pre-charge operation to set the voltage of the first gut node GutA and the voltage of the input line Digit. The pre-charge operation may take place after the digit equalization. During the pre-charge operation, the sense amplifier enable signal SAEN may be activated to close the enable switch 352 and couple the first gut node GutA to the power supply voltage VDD. The first gut node GutA and the gut node capacitor CC may pre-charge to the power supply voltage VDD. When the word line is activated (e.g., by row decoder 118 of FIG. 1) and the input line Digit is connected to the bit line, the memory cell is read onto the input line Digit, providing it with a voltage based on the data stored in the memory cell.

After the voltage is provided to the input line Digit, the sense amplifier enable signal SAEN may deactivate causing the enable switch 352 to open, decoupling GutA from VDD. The plate voltage may begin to ramp from VDD to the ground voltage. Since the voltage on the input line Digit is coupled to the plate voltage via the cell, the voltage along the input line Digit may also begin to decrease towards the ground voltage at a rate based on the ramp rate of the plate voltage. When the voltage of the input line Digit falls below a threshold voltage of the transistor 354 (determined by VCASC) the voltage of the first gut node GutA will also begin to fall. As the voltage of the first gut node GutA falls below a trigger voltage of the hysteresis inverter 342, the voltage of the second gut node GutB will increase. The rising voltage of the second gut node GutB operates the feedback transistor 356 which drains the input line Digit to ground, to prepare the input line Digit for subsequent operations, such as a write-back operation. The second gut node GutB is coupled to the latch circuit 330 via an inverter circuit 344. Thus, when the voltage on the second gut node GutB rises above an inverter trigger voltage of the inverter 344, a low voltage will be provided to the latch circuit 330.

Since the input line digit was provided a voltage from a memory cell, the operation timing of the sense amplifier 322 will vary depending on the initial value of the voltage from the memory cell. In particular, the time it takes for the voltage on the input line Digit to reach the ground voltage will depend on initial voltage of the input line Digit, since the rate at which the input voltage decreases is based on the ramp rate of the plate voltage and is constant for the sense amplifier 322. In this manner, the time it takes the first and second gut nodes GutA and GutB to transition to the limit voltage will also depend on the initial voltage on the input line Digit provided by the accessed memory cell.

FIG. 3B shows a reference sense amplifier 324. As previously mentioned, the reference sense amplifier 324 may generally have the same components as the sense amplifier 322 of FIG. 3A. However, the second gut node GutB of the reference sense amplifier 324 is provided to a delay circuit 340 instead of to an inverter 344. The delay circuit 340 may also be provided a time delay adjustment signal tmDelay. The delay circuit 340 may be an inverting delay circuit, which may provide a logic low output when the input is a logic high, and vice versa. When the voltage on GutB rises above a delay trigger voltage of the delay circuit 340, the delay circuit 340 may wait for a time based on the time delay adjustment signal tmDelay and then provide a delayed reference signal CRef0 as a logic low signal. The activation of the delayed reference signal CRef0 (e.g., when it transitions from logic high to logic low) may be provided to the latch circuits 330, causing them to latch the voltage on the second gut nodes GutB of the sense amplifiers 322.

The reference sense amplifier 324 has an input line Ref Digit 0 which is coupled to a reference bit line (e.g., BLRef of FIG. 2) with at least one reference memory cell that contains a known logical value, in this example the known logical value is a low logical value (e.g., '0'). When the reference memory cell is accessed, a reference 'low' logic voltage is provided along the reference bit line to the input line Ref Digit 0. Accordingly, the reference sense amplifier 324 may provide a reference (or model) for the behavior of a sense amplifier 322 which is coupled to a memory cell with a low logical value. Thus, the delay circuit 340 of the reference sense amplifier 324 may be activated at a similar timing to the inverter circuit 344 of a sense amplifier 342 coupled to an accessed memory cell with a low logical value.

Figures 4A, 4B:
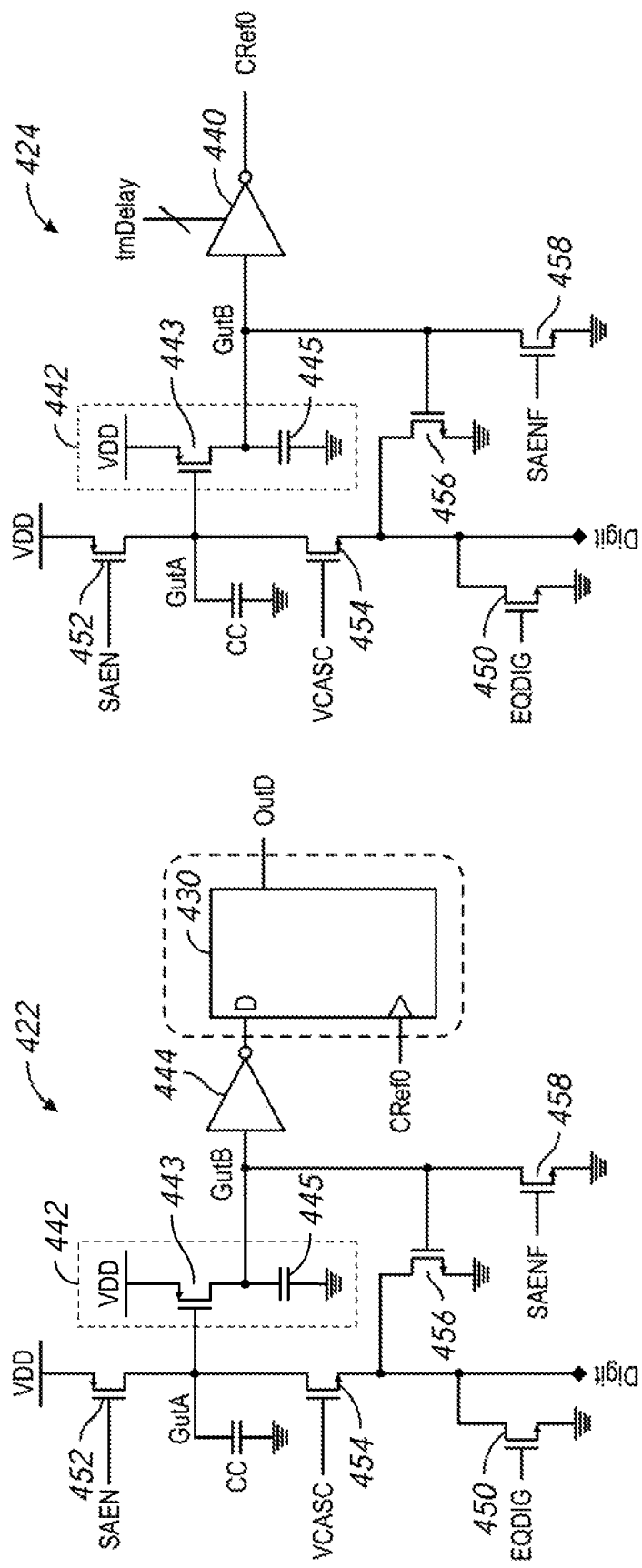
FIGS. 4A-4B are block diagrams of an implementation of a sense amplifier and a reference amplifier, respectively, according to an embodiment of the present disclosure.

FIGS. 4A-4B shows a sense amplifier 422 and a reference sense amplifier 424 which, in some embodiments, are specific implementations of the sense amplifier 322 of FIG. 3A and the reference sense amplifier 324 of FIG. 3B. The sense amplifiers 322 and 422 and the reference amplifiers 324 and 424 are generally similar, except that in FIGS. 4A-4B, the generic switches of FIG. 3A-3B have been replaced with transistors, and specific circuit components to form the hysteresis inverter 442 are shown. In particular, the equalization switch 350 has been replaced with the equalization transistor 450, and the enable switch 352 has been replaced with enable transistor 452. The hysteresis inverter 342 has been replaced with hysteresis inverter 442, which includes a transistor 443 and a capacitor 445. The sense amplifier 422 also has an additional initialization transistor 458 coupled to selectively connect the second gut node GutB to the ground voltage when an inverse of the sense enable signal (SAENF) is active.

The hysteresis inverter 442 includes a transistor 443 which selectively couples the power supply voltage VDD to the second gut node GutB in response to the voltage of the first gut node GutA. When the voltage of the first gut node GutA falls below a trigger voltage of the transistor 443, the limit voltage VDD is coupled to the second gut node GutB and begins to charge the capacitor 445, causing the voltage on GutB to increase to VDD over time. The second gut node GutB of the sense amplifier 422 is also selectively coupled to the ground voltage with a transistor 458 activated by an inverse of the sense amplifier enable signal (SAENF). The inverse signal SAENF may be a logical inverse of the signal SAEN. Thus, the second gut node GutB may be pre-charged to a ground voltage when the sense amplifier enable signal SAEN is not active.

Thus, in an example operation, a memory cell is accessed and provides a voltage to the input line Digit. A plate voltage is decreased to ground, which causes the voltage on the input line Digit to decrease. When the input line voltage falls below a level determined by the bias voltage VCASC and the transistor 454 starts conducting current, the voltage on the first gut node GutA (which was initialized to VDD) begins to fall as it is drained through transistor 454. When the voltage on GutA falls below a trigger voltage of the transistor 443, the voltage VDD begins to charge capacitor 445, which causes the voltage on GutB to increase. The increasing voltage along GutB will reach a trigger voltage of the transistor 456, coupling the input line digit to ground, and initializing the input line Digit for subsequent operations (e.g., a write-back operation). The increase of the GutB voltage will also increase above a trigger voltage of the inverter 444, which will provide an inverted signal (e.g., a low voltage) to the latch circuit 430.

FIG. 4B shows a reference sense amplifier 424 which may operate in a similar manner as the sense amplifier 422. Instead of being coupled to an inverter (e.g., inverter 444 of FIG. 4A), the reference sense amplifier is coupled to a time delay circuit 440 so that the rising voltage of GutB provides the time delay signal CRef0 in a manner similar to the operation of reference sense amplifier 324 of FIG. 3B.

Figure 5:
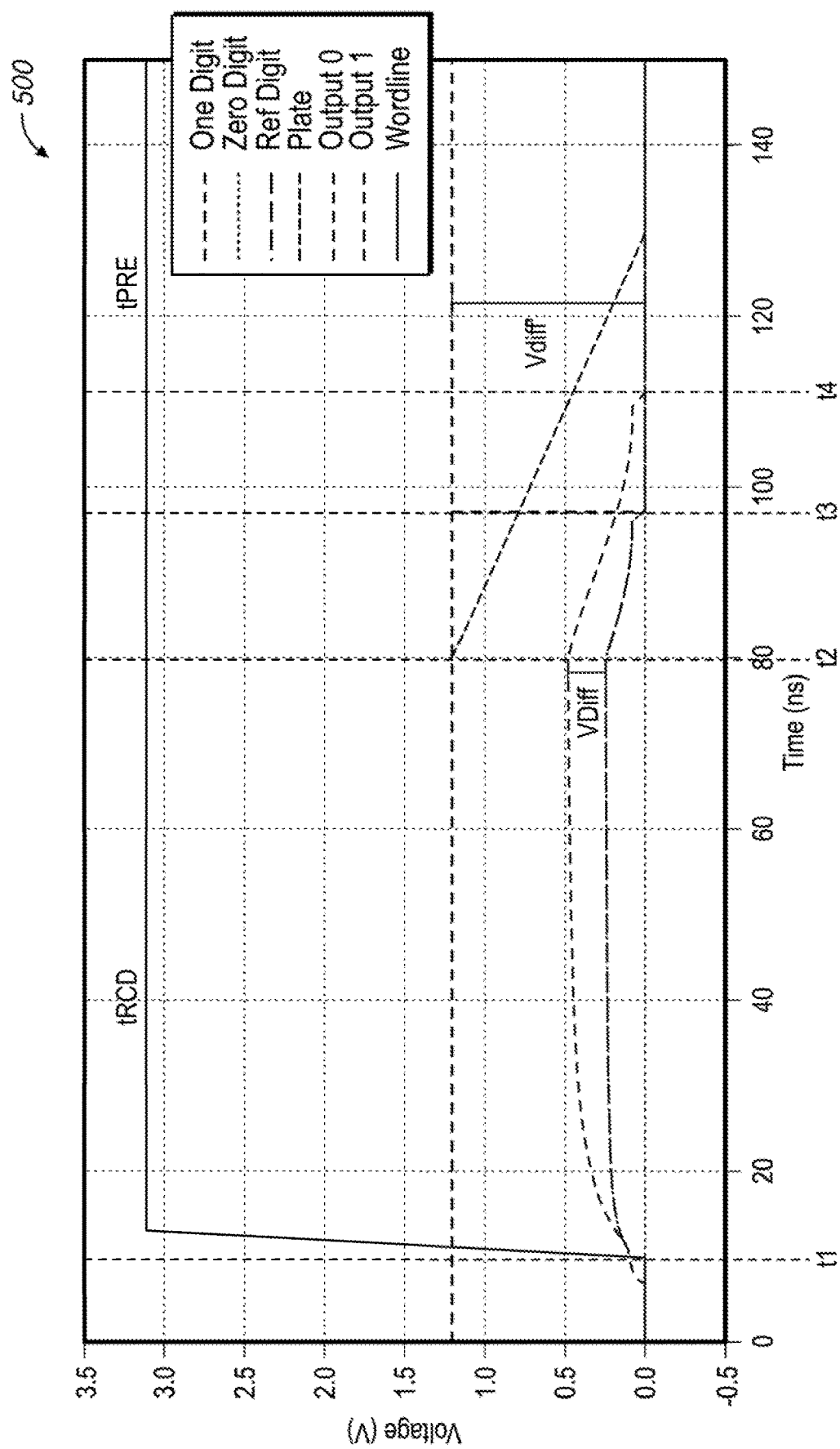
FIG. 5 is a graph of signals of a sense amplifier and reference amplifier according to an embodiment of the present disclosure.
Figure 6:
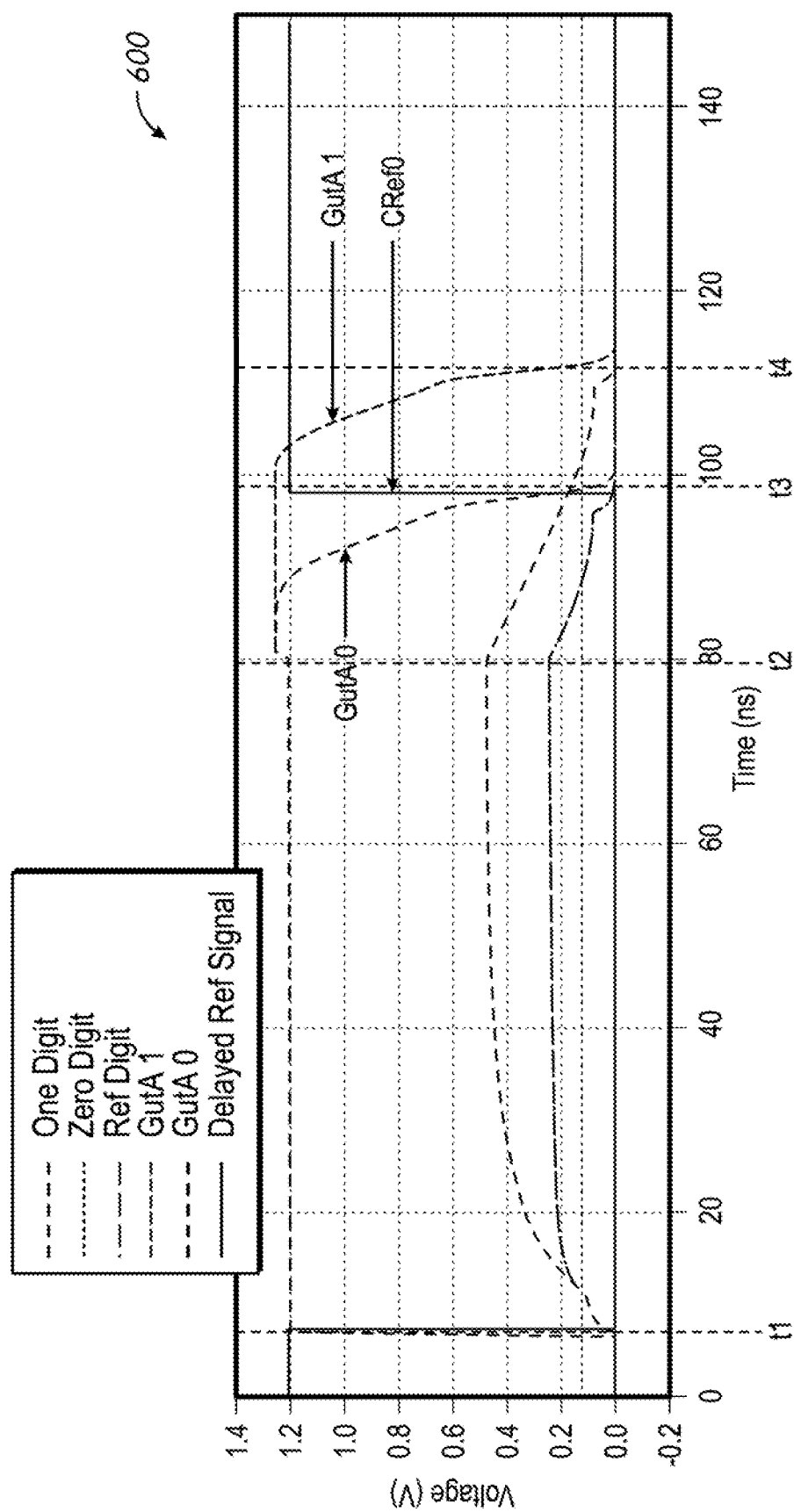
FIG. 6 is a graph of signals of a sense amplifier and reference amplifier according to an embodiment of the present disclosure.
Figure 7:
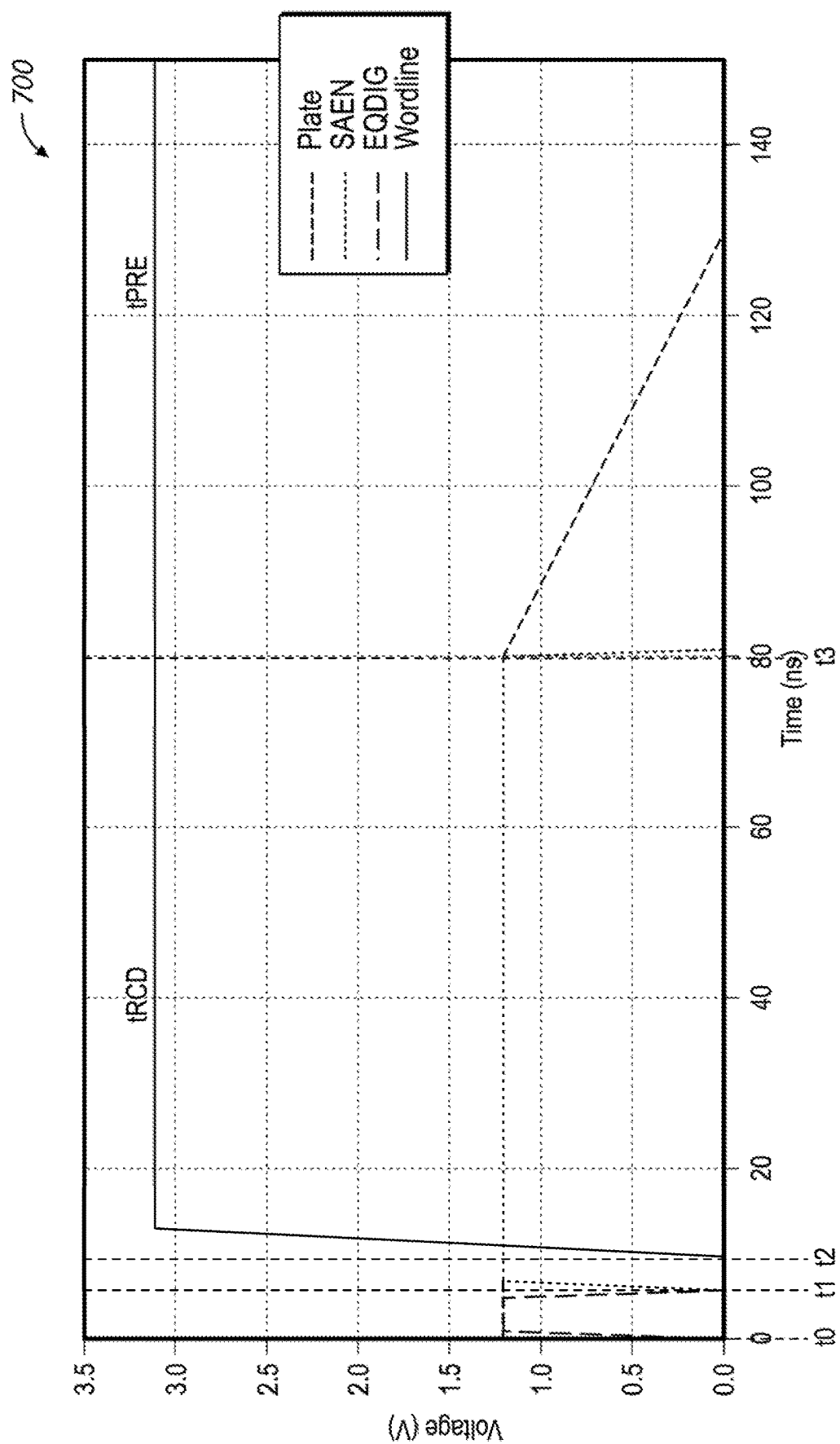
FIG. 7 is a graph of command signals of a memory according to an embodiment of the present disclosure.

FIGS. 5-7 are graphs depicting an operation of sense and reference amplifiers according to some embodiments of the present disclosure. The graphs 500-700 of FIGS. 5-7 depict the operation of an embodiment where a plate voltage is ramped from a high voltage (e.g., power supply voltage VDD) to a low voltage (e.g., ground or voltage VSS). The graphs 500-700 may correspond to the particular operation of specific circuits, such as the sense amplifiers 322/422 and reference sense amplifiers 324/424 of FIGS. 3A-4B. Although these circuits may have specific waveforms, it should be understood that variations are possible (e.g., by changing capacitor values in the circuits) which may vary the shape of the signals. Similarly, while specific values are shown for both time and voltage along the x- and y-axes of the graphs, it is to be understood that these are example values only, and that different embodiments of the present disclosure may, for example, operate at faster or slower times, or at higher or lower voltages.

FIG. 5 is a graph 500 of signals of a sense amplifier and reference amplifier according to an embodiment of the present disclosure. The graph 500 shows the voltage along a word line of the memory during a read command. The word line is initially at a low voltage, but increases to a high voltage level at a first time (t1) to enable data to be read from the memory cells of the word line. The activation of the word line at t1 causes the voltages of an example memory cell containing a first logical value (One Digit), an example memory cell containing a second logical value (Zero Digit), and a reference bit line containing a memory cell with the second logical value (Ref Digit) to be provided to the input line of respective sense amplifiers. A voltage of the input line (e.g., input line Digit of FIGS. 3A and 4A) of the sense amplifier increases with time (between t1 and t2) as the data is sensed from the coupled memory cell.

The three input lines (One Digit, Zero Digit, and Ref Digit) of the respective sense amplifiers each build to a voltage associated with their respective logical values. In the example of FIG. 5, the One Digit is a high logical value (a '1') and both the Zero Digit and the Ref Digit each have a low logical value (a '0'). The high logical value is sensed as a higher voltage than the low logical value. As shown, both the sensed high and low logical values are above a ground voltage, and there is a voltage difference VDiff between them. Although only a single One Digit and Zero Digit are shown, there may be a plurality of bit lines connected to a plurality of sense amplifiers, each with either a high or low logic value. Minor variations may exist between the voltages for a given logical value, which may be addressed by the time delay of the cutoff, as described herein.

After a delay (e.g., from t1 to t2) to allow the voltages sensed from the memory cells to stabilize, a voltage on the plate (e.g., plate 226 of FIG. 2) is ramped beginning at a second time (t2). The plate voltage may be controlled by a ramp control circuit (e.g., circuit 240 of FIG. 2). In the example operation of FIGS. 5-7, the plate voltage decreases from a power supply voltage VDD to a ground voltage. It should be noted that while VDD and ground are used as the first and second voltages of the plate, other voltage values may be used. It should also be noted that while VDD is referred to as the power supply voltage, it may refer to any internal voltage output by a power supply of the memory (e.g., a voltage from voltage generator 136 of FIG. 1). The plate voltage may be initialized to a first voltage (e.g., VDD) opposite a second voltage (e.g., ground) at some time before the word line is activated (e.g., before t1). The ramp control circuit may cause the plate voltage to decrease in a linear manner over time. Since the input line voltages are coupled to the plate voltage via the cell, at time t2 the voltages of the input lines (One Digit, Zero Digit, and Ref Digit) also begin decreasing at a rate based on the rate of the plate voltage ramp. Although the rate at which the input lines change voltage is based on the linear rate of the plate ramp, the input lines do not necessarily decrease in a linear fashion. However, since the plate is coupled to all the input lines (via the bit lines and cells), they will all decrease in voltage in a similar manner.

At some time between t2 and a third time (t3), the voltage on the input lines coupled to memory cells with low logic values (Zero Digit and Ref Digit) fall below a trigger voltage, which causes a change in the state of the circuit. As described in regards to FIG. 3A-4B, as the input line voltage falls, it pulls a first gut node GutA voltage below a trigger voltage of a hysteresis inverter causing the voltage of the second gut node GutB to rise, which in turn may activate an inverter (e.g., inverter 344/444) to provide an opposite voltage (e.g., a low voltage when GutB is high). The output of the inverter may be the output of the sense amplifier (e.g., Output 0). As may be seen just before the time t3, the feedback transistor 356/456 is activated to quickly drop the voltage of the input lines (Zero Digit and Ref Digit) to the ground voltage.

Referring back to FIG. 5, at the third time (t3), the falling voltage along the input lines coupled to memory cells with low logic values (Zero Digit and Ref Digit) has fallen below a trigger voltage, which causes the hysteresis inverter (e.g., 342/442) to provide a high voltage to the inverter (e.g., inverter 344/444) causing the inverter to switch from providing a high voltage (e.g., VDD) to providing a low voltage (e.g., ground). Note that at t3 the voltage of the input line One Digit is still above ground because the input line One Digit started with VDiff more voltage, thus One Digit remains above the trigger voltage and the output from the sense amplifier coupled to One Digit remains at a high voltage (e.g., VDD). The One Digit may reach the ground voltage at a fourth time (t4), and may fall below a trigger voltage of its respective sense amplifier between t3 and t4. Similar to the operation of the sense amplifiers coupled to the memory cell with the low logic value (e.g., Zero Digit), at a time just before t4, the feedback transistor of the sense amplifier coupled to One Digit is activated and drains the One Digit to ground.

In this manner, the sense amplifiers convert the voltage difference VDiff between high and low logic values into a time window (e.g., between t3 and t4). As described in detail in FIG. 6, the sense amplifiers may define a cutoff time based on when the Ref Digit reaches a ground voltage. Any sense amplifiers whose input lines fall below a trigger voltage at or before the cutoff time (e.g., Zero Digit) are determined to have a same logic value as the Ref Digit, while any input lines which remain above the trigger voltage at the cutoff time (e.g., One Digit) are determined to have an opposite logic value to the Ref Digit. The cutoff time may be chosen to be after the Zero Digit falls below the trigger voltage but before the One Digit falls below the trigger voltage so as to distinguish between the Zero Digit and the One Digit.

As shown in FIG. 5, an output of a sense amplifier coupled to the Zero Digit (Output 0) switches from a high value to a low value (e.g., from VDD to ground). Since a cutoff time elapses sometime before the voltage on One Digit falls below the trigger voltage, when the One Digit does fall below the trigger voltage, the latch (e.g., 330, 430) is no longer sensitive to changes in voltage and an output of a sense amplifier coupled to the One Digit (Output 1) remains at a high value (e.g., at VDD). Output 0 and Output 1 may be provided to other circuit components coupled to the memory. In this manner, sense amplifiers coupled to memory cells with a low logic value output a ground voltage, while sense amplifiers coupled to memory cells with a high logic value output a power supply voltage VDD. The Output 1 and the Output 0 may have a difference of VDiff, which may be greater than the difference VDiff of the One Digit and Zero Digit.

FIG. 6 is a graph of signals of a sense amplifier and reference amplifier according to an embodiment of the present disclosure. FIG. 6 shows a graph 600 which depicts internal signals of a sense amplifier. Similar to the graph 500 of FIG. 5, graph 600 shows the operation of a reference sense amplifier and a pair of sense amplifiers each coupled to an example memory cell with a high and a low logic value, respectively. While graph 600 also has time points t1-t4, these are not necessarily the same time points at the graph 500. Graph 600 shows a voltage along an input line Ref Digit coupled to a reference memory cell with a low logical value, a voltage along an input line coupled to an example memory cell with a high logical value One Digit and an input line coupled to an example memory cell with a low logical value Zero Digit. The graph 600 also shows the delayed timing signal CRef0, which is provided by a reference sense amplifier coupled to the Ref Digit. Also shown are the voltages of first gut nodes GutA 0 and GutA 1 corresponding to sense amplifiers (e.g., sense amplifiers 322/422 of FIGS. 3A and 4A) coupled to the Zero Digit and One Digit, respectively.

At a first time (t1), the delayed timing signal CRef) drops from a high voltage (e.g., VDD) to a low voltage (e.g., VSS or ground). This may reset the latch circuits coupled to the sense amplifiers. Although not shown on this graph, a word line is activated and memory cells are read onto the input lines (One Digit, Zero Digit, and Ref Digit), and the voltages of the input lines begin increasing to their maximum values based on the value of the memory cell.

At a second time (t2), a plate voltage (not shown) begins ramping from a high voltage (e.g., VDD) towards a ground voltage. Because the input line voltages are coupled to the plate voltage via the cell, they also begin decreasing towards a ground voltage. The decrease in the input line voltages causes the voltage on the first gut nodes (Gut A 0 and GutA 1) of their respective sense amplifiers to begin decreasing (e.g., as the voltage from GutA begins to flow through the transistor 354/454 of FIG. 3A-4B). While the voltages on the input lines may begin falling at t2, the voltage along GutA may remain at a high voltage until the voltage on the input line falls below a voltage determined by the transistor 354/454 and the bias voltage VCASC of FIGS. 3A-4B. Thus, the gut node voltage of the gut node GutA 0 coupled to Zero Digit (or Ref Digit) may begin to drop at a time before t3, while the gut node GutA 1 coupled to the One Digit remains at a high voltage at t3.

At some point before t3, a gut node coupled to Ref Digit (which may have a similar trace to GutA 0) falls below a trigger voltage of the hysteresis inverter 342/442 of FIG. 3A-4B, causing GutB to rise and triggering the delay circuit to provide the delayed reference signal CRef0 at t3. At a fourth time (t4), the One Digit falls to ground. At some time before t4, but after t3, the voltage on GutA 1 falls below a trigger voltage of the hysteresis inverter causing a switch in the output voltage an inverter coupled to GutA 1. The delayed reference signal CRefDt may be provided to latch circuits coupled to the sense amplifiers to 'latch' a signal provided by the sense amplifier at the time the delayed reference signal was provided. Note that at the t3 when CRef0 activates, GutA 0 has already dropped to a low voltage level (e.g., about 0V), while the GutA 1 remains at a high voltage level. Thus, the output voltage coupled to GutA 0 (e.g., Output 0) would be low at t3, while the output voltage coupled to GutA 1 (e.g., Output 1) would be high at t3. In this manner, the trigger voltage of the sense amplifier along the input line (e.g., Digit of FIGS. 3A and 4A) may depend both on a trigger voltage of the hysteresis inverter (e.g., 342/442 of FIGS. 3A-4B) and on the bias voltage VCASC and transistor 354/454.

The delay between when the Ref Digit falls below a voltage to trigger the reference sense amplifier and t3 may be determined the delay circuit (e.g., delay circuit 246 of FIG. 2) and may be based on a rate at which plate voltage is ramped. Although GutA 1 continues to change after t3, the activation of the delayed reference signal CRef0 at t4 has already latched the value of Output 1 at t3, and that value will be latched as the voltage corresponding to the original logical value of the coupled memory cell, ignoring further changes after t3.

FIG. 7 is a graph 700 of command signals of a sense amplifier and reference amplifier according to an embodiment of the present disclosure. The graph 700 depicts command signals of a sense amplifier. The graph 700 depicts a word line voltage as well as a plate voltage and command signals EQDIG and SAEN. The command signals may be provided to sense amplifiers and/or reference amplifiers of a memory.

The digit equalization signal EQDig may be a pulse which pulls an input line of a sense amplifier to ground before data is read onto it from a bit line. The signal EQDIG may be triggered at time t0, which is before the other signals are triggered. The signal EQDIG is active for long enough to equalize the voltages on the input lines, and then deactivated to decouple the input lines from the ground voltage. After the signal EQDIG is deactivated, the sense enable signal SAEN is activated at a first time (t1). As shown here the signal SAEN is activated after the signal EQDIG is deactivated. There may be a delay between these events in other embodiments. SAEN could also be activated after the second time (t2) in other embodiments. The activation of SAEN causes a gut node of the sense amplifier (GutA) to precharge to a power-supply voltage (VDD).

At a second time (t2), the word line is activated, causing voltage to build up on the input lines of the memory cell array. At a third time (t3), the signal SAEN is deactivated and the plate voltage begins ramping towards the ground voltage. This may cause a voltage on the gut node GutA to begin ramping down as well. When the gut node voltage falls below a trigger voltage of the hysteresis inverter, an output signal corresponding to the logical value of the coupled memory cell is provided, which may be collected as an output by a latch circuit.

Figure 8B:
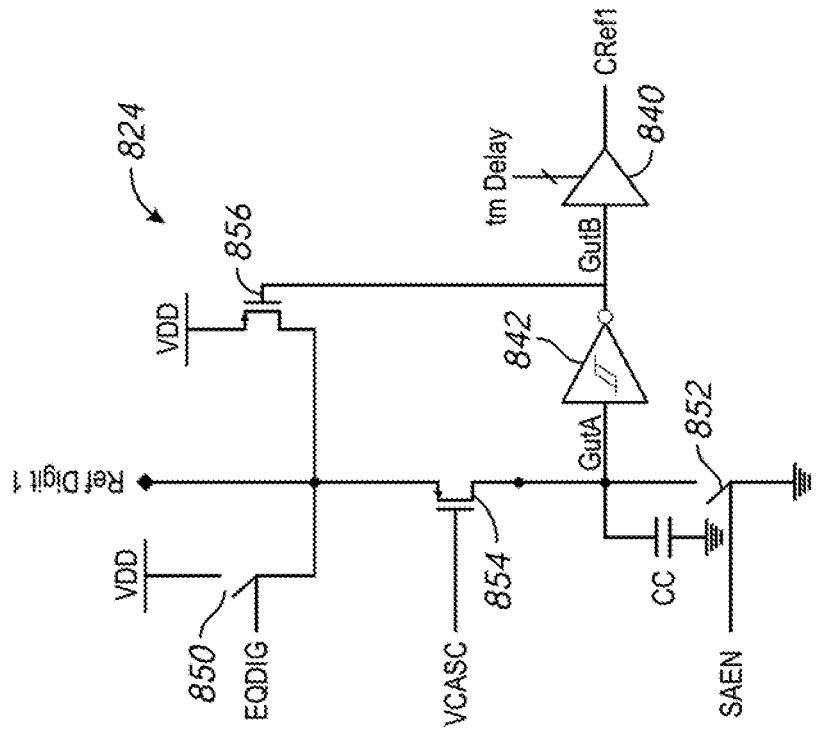
FIGS. 8A-8B are block diagrams of a sense amplifier and reference amplifier, respectively, according to an embodiment of the present disclosure.
Figure 8A:
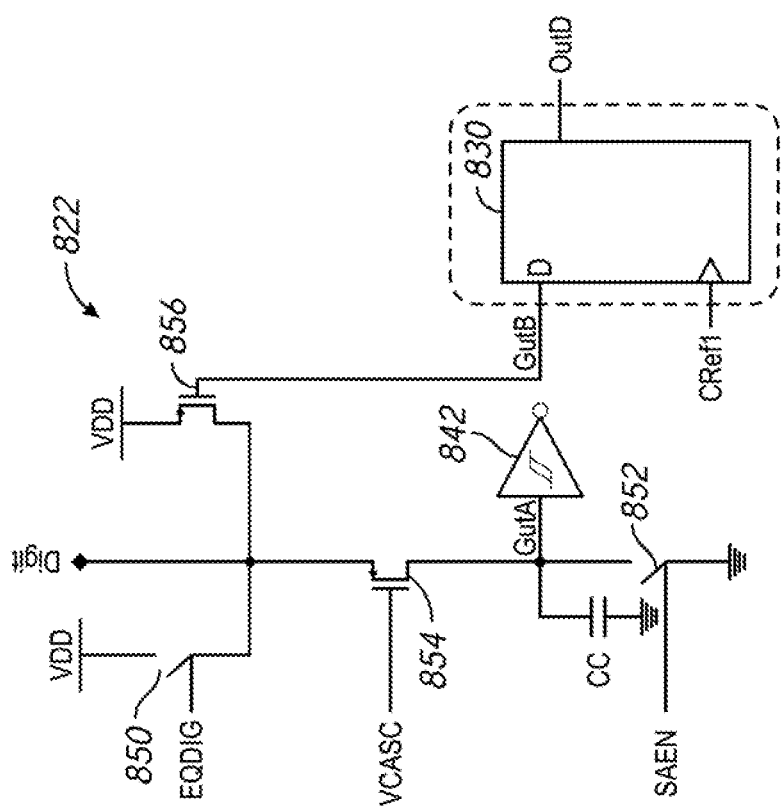

FIGS. 8A-8B are block diagrams of a sense amplifier and reference amplifier, respectively, according to an embodiment of the present disclosure. The sense amplifier 822 and the reference amplifier 824 operate on a similar principle to the reference amplifier 322 and sense amplifier 324 of FIG. 3A-3B, except that the sense amplifier 822 and reference amplifier 824 are coupled to a plate which increases in voltage during sensing. In particular, the amplifiers 822/824 are coupled (via a bit line and activated memory cell) to a plate which increases from a ground voltage to a power supply voltage VDD during sensing. The sense amplifier 822 and reference amplifier 824 may have similar components and operation, and so in the interest of brevity, only sense amplifier 822 will be discussed in detail. However, it is to be understood that the reference amplifier 824 may have similar components and operations.

FIG. 8A shows a sense amplifier 822. The sense amplifier 822 has an input line Digit which is coupled to a bit line and receives a voltage from a memory cell when the memory cell is activated (e.g., by activating the word line coupled to the memory cell). The input line Digit is selectively coupled to the voltage VDD through an equalization switch 850 and to a transistor 854. The transistor 854 is coupled to a bias voltage VCASC and to a first gut node GutA of the circuit. GutA is coupled to ground through a gut node capacitor CC and selectively coupled to ground through an enable switch 852. GutA provides a voltage as the input of a hysteresis inverter 842, which provides an output voltage to a second gut node GutB. GutB provides a voltage to a latch circuit 830 and to a feedback transistor 856, which selectively couples the input line Digit to VDD.

The equalization switch 850 is activated by a digit equalization signal EQDIG. When EQDIG closes the equalization switch 850, the input line Digit is coupled to VDD. The enable switch 852 is activated by a sense amplifier enable signal SAEN. When SAEN closes the switch 852, GutA and the gut node capacitor CC are discharged to a ground voltage. The signals EQDIG and SAEN close and open the digit equalization switch 850 and the enable switch 852 to pre-charge the sense amplifier 822 for operation.

When the memory cell coupled to the input line Digit is activated, a voltage is read onto the input line Digit, causing its voltage to fall from VDD to a lower value. The signal EQDIG causes the equalization switch 850 to open at some time before the memory cell is activated. The voltage of the input line Digit depends on the logical value stored in the memory cell. An input line Digit coupled to an activated memory cell with a low logical value may be provided a lower voltage than an input line Digit coupled to an activated memory cell with a high logical value.

The voltage on the input line Digit may be coupled to a voltage on a plate via the cell, which begins to change from a ground voltage to VDD. The change in voltage on the plate may cause the voltage on the input line Digit to also increase. At some point before the plate voltage begins changing, the enable signal SAEN may open the enable switch 852. As the voltage on Digit increases, current may flow through transistor 854 which may begin charging gut node capacitor CC, increasing a voltage of GutA. The voltage that the input line Digit must reach to begin raising the voltage of GutA may be based, at least in part, on the bias voltage VCASC applied to transistor 854.

As the voltage of GutA increases, it may increase past a trigger voltage of the hysteresis inverter 842. Once the hysteresis inverter 842 is triggered, it may cause a voltage of the second gut node GutB to begin decreasing in response to the rising voltage of GutA. The falling voltage of GutB may activate feedback transistor 856, which couples the voltage VDD to the input line Digit, to prepare the input line Digit for subsequent operations (e.g., a write-back operation). The voltage of GutB is provided to a latch circuit, which latches the voltage of GutB when a delayed timing signal CRef1 is provided.

FIG. 8B shows a reference amplifier 824 which provides the delayed reference signal CRef1. The reference amplifier 824 may have an input line Ref Digit 1 which is coupled to a reference bit line which is coupled to reference memory cells with known logical values. In the example of FIG. 8B, the known logical values are high logical values (e.g., '1'). Rather than being provided to a latch circuit (as in sense amplifier 822 of FIG. 8A), the second gut node GutB of the reference amplifier 824 is provided to a delay circuit 840. The delay circuit 840 may operate in a similar manner to the delay circuit 340/440 of FIGS. 3B and 4B. However, unlike the delay circuit 340 of FIGS. 3B and 4B, the delay circuit 840 of FIG. 8B does not invert the voltage provided by GutB. The delay circuit 840 is triggered by the voltage of GutB falling below an activation voltage of the delay circuit 840.

Figures 9A, 9B:
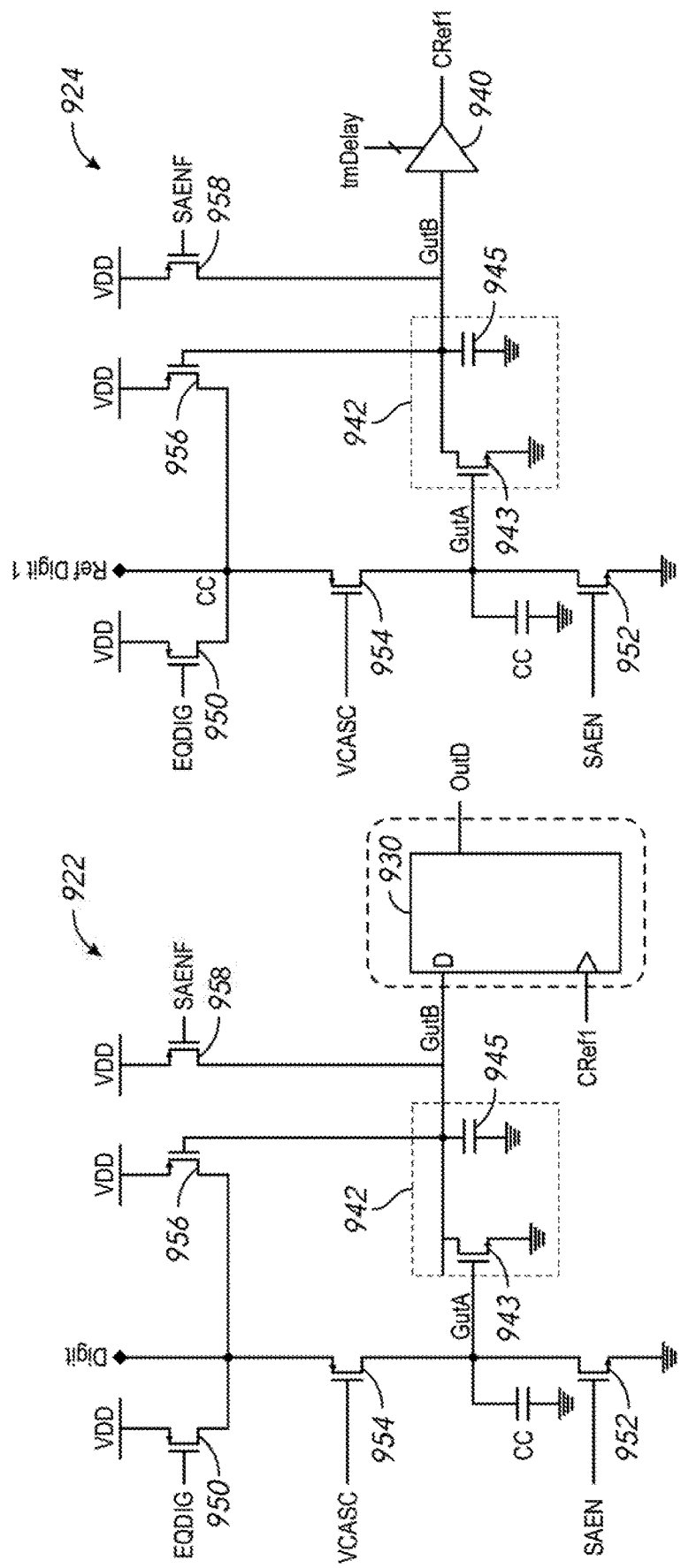
FIGS. 9A-9B are block diagrams of an implementation of a sense amplifier and a reference amplifier, respectively, according to an embodiment of the present disclosure.

FIGS. 9A and 9B show a sense amplifier and a reference amplifier, respectively, according to an embodiment of the present disclosure. The sense amplifier 922 of FIG. 9A may be an implementation of the sense amplifier 822 of FIG. 8A, and the reference amplifier 924 of FIG. 9B may be an implementation of the reference amplifier 924 of FIG. 8B. As with FIGS. 8A and 8B, since the sense amplifier 922 and reference amplifier 924 are similar, a detailed description will be provided only for the sense amplifier 922 of FIG. 9A. However it is to be understood that the reference amplifier 924 of FIG. 9B may have similar components and operation to the sense amplifier 922.

FIG. 9A shows a sense amplifier 922 which may generally be similar to the sense amplifier 822 described in FIG. 8A. The sense amplifier 922 replaces equalization switch 850 with equalization transistor 950, and enable switch 852 with enable transistor 952. The hysteresis inverter 942 is shown as including a transistor 943 which selectively couples GutB to ground in response to the voltage on GutA, and a capacitor 945 coupled to GutB and to ground. The sense amplifier 922 also has a transistor 958 which selectively couples GutB to VDD in response to an enable signal SAENF. The transistor 958 may be activated by SAENF to charge GutB and the capacitor 945 to VDD in preparation for amplification of a signal from the memory cell coupled to the sense amplifier 922.

As the voltage along GutA rises in response to the rising voltage of the input line Digit, the voltage GutA will cross a trigger voltage of the transistor 943. When the trigger voltage is passed, the transistor 943 may couple GutB to ground, which may cause a voltage of GutB to fall as the capacitor 945 discharges. The voltage on GutB is provided as an output of the sense amplifier 922, and may be latched by latch circuit 930 in response to activation of a delayed timing signal CRef1.

FIG. 9B shows a reference amplifier 924 which provides the delayed timing signal CRef1. The reference amplifier 924 may operate in a manner similar to the sense amplifier 922 of FIG. 9A. The reference amplifier 924 has an input line Ref Digit 1 which is coupled to a reference memory cell with a known high logic value. The voltage on GutB is provided to a time delay circuit 940. When the voltage on GutB falls below an activation voltage of the time delay circuit 940, the time delay circuit provides the delayed reference signal CRef1 after a delay based on the time delay adjustment signal tmDelay.

Figure 10:
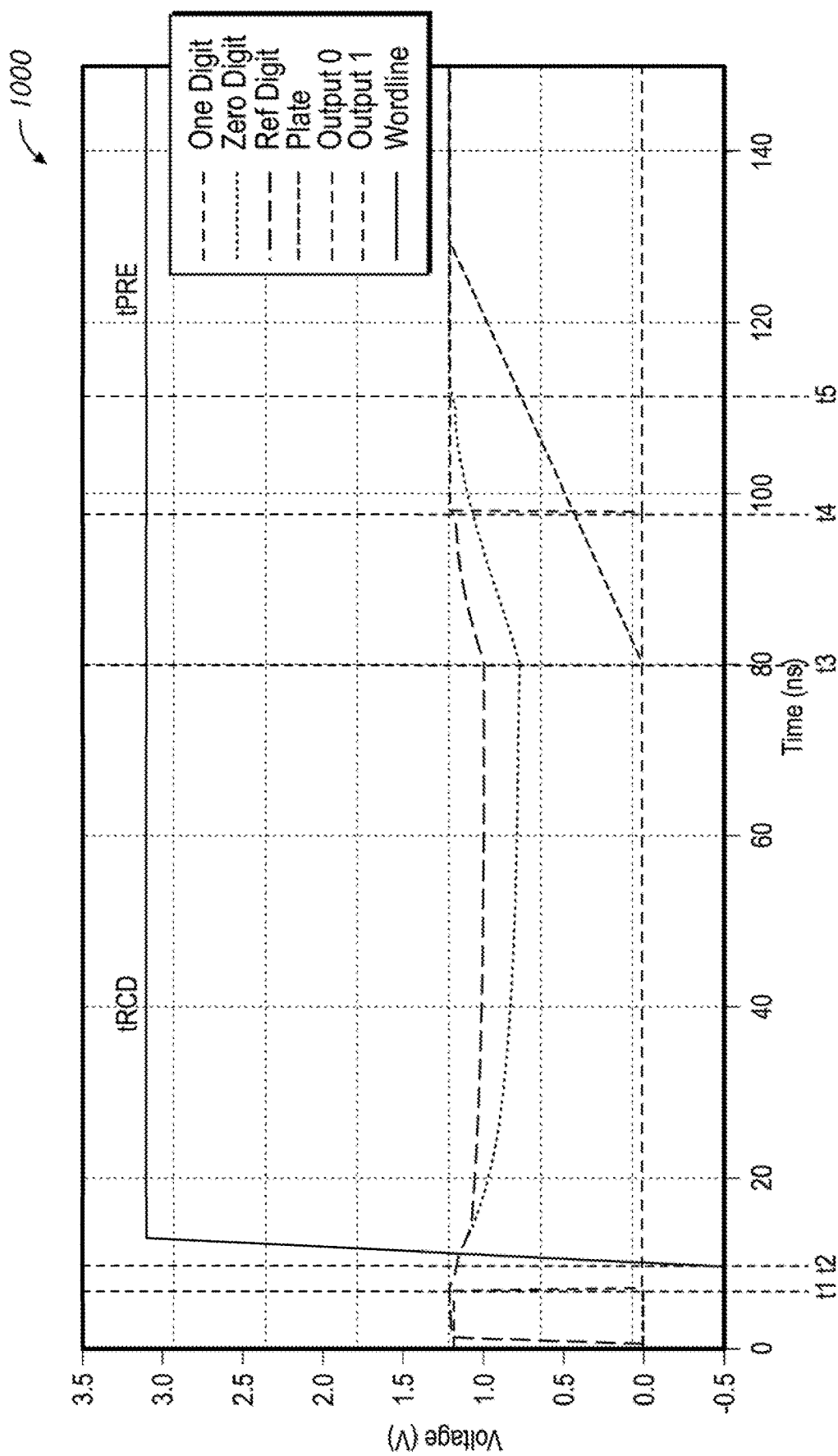
FIG. 10 is a graph of signals of a sense amplifier and reference amplifier according to an embodiment of the present disclosure.

FIG. 10 shows signals of a sense amplifier and reference amplifier according to an embodiment of the present disclosure. FIG. 10 has a graph 1000 depicting an operation of sense and reference amplifiers according to some embodiments of the present disclosure. The graph 1000 depict the operation of an embodiment where a plate voltage is ramped from a low voltage (e.g., ground) to a high voltage (e.g., VDD) during sensing. The graph 1000 may correspond to the particular operation of specific circuits, such as the sense amplifiers 822/922 and reference sense amplifiers 824/924 of FIGS. 8A-9B. Although these circuits may have specific waveforms, it should be understood that variations are possible (e.g., by changing capacitor values in the circuits) which may vary the shape of the signals. Similarly, while specific values are shown for both time and voltage along the x- and y-axes of the graphs, it is to be understood that these are example values only, and that different embodiments of the present disclosure may, for example, operate at faster or slower times, or at higher or lower voltages.

The graph 1000 shows an output voltages Output 0 and Output 1 of sense amplifiers coupled to example memory cells with a low and high logical value respectively. At a first time (t1), the voltage Output 1 is reset from a high voltage (e.g., VDD) to a low voltage (e.g., ground) to prepare for a subsequent memory read operation.

At a second time (t2), the word line is activated (a voltage is applied to the word line). This causes a voltage to be sensed from memory cells along that word line onto the input lines of their respective sense amplifiers. In particular, graph 1000 shows voltages along an input line Zero Digit of a sense amplifier coupled to an example memory cell with a low logic value, a voltage along an input line One Digit of a sense amplifier coupled to an example memory cell with a high logic value, and an input line Ref Digit of a reference amplifier coupled to a reference memory cell with a high logic value. The voltages of the input lines may decrease over time towards a value based on the logic value of their respective activated memory cells. Thus, by a third time (t3), the voltages of Ref Digit and One Digit have a higher value than the voltage of Zero Digit.

At t3, after the voltages of the input lines have stabilized, a voltage on the plate is increased from a low voltage (e.g., ground) to a high voltage (e.g., VDD). Since the input lines (One Digit, Zero Digit, and Ref Digit) are coupled to the plate via the cell, as the plate voltage increases, the voltages of the input lines also increases. At a fourth time (t4), the output line Output 1 coupled to the input line One Digit, which in turn is coupled to a memory cells with a high logic value, flips to a high value. At some point before t4, the voltage of One Digit causes the sense amplifier to trigger. In some examples, the voltage of One Digit may be a voltage of the input line Digit of the sense amplifier 922 of FIG. 9A. Thus the increase in One Digit may cause the voltage of GutA to increase as the gut node capacitor CC charges. When GutA rises above a trigger voltage of the hysteresis inverter 942, the output of the circuit at the latch circuit 930 transitions to a high value.

In the example of FIG. 10, the reference amplifier is coupled to Ref Digit, which is coupled to an activated memory cell with a high logical value. Thus, the reference amplifier may behave in a manner similar to a sense amplifier coupled to an activated memory cell with a high logical value (e.g., the sense amplifier of One Digit and Output 1). At a fifth time (t5), the voltage on Zero Digit will also reach the voltage VDD. At some time after t4 (determined by the time delay signal tmDelay of FIG. 9B) but before t5, the latch circuits will latch the voltages on Output 1 and Output 0. Thus, the latch circuit will hold a high voltage (e.g., VDD) for Output 1 and a low voltage (e.g., ground) for Output 0.

Figure 11:
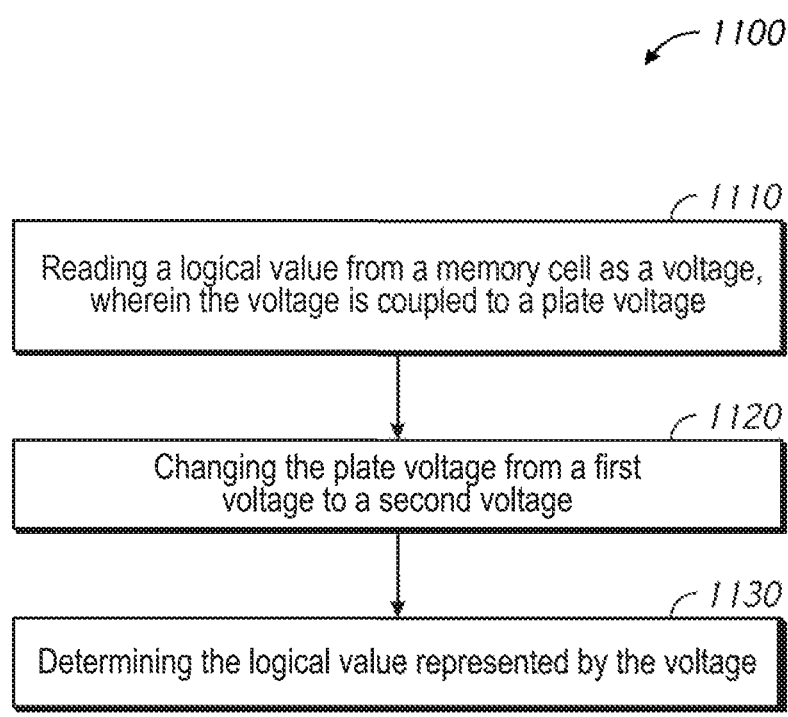
FIG. 11 is a block diagram depicting a method of amplifying a signal of a memory cell according to an embodiment of the present disclosure.

FIG. 11 is a flow diagram depicting a method of amplifying a signal of a memory cell according to an embodiment of the present disclosure. The method 1100 may include one or more steps, such as the steps outlined in blocks 1110-1130. The method 1100 may include more (or fewer) steps than those shown in FIG. 11. One or more steps may be repeated, and the steps may be carried out in any order.

Block 1110 recites "Reading a logical value from a memory cell as a voltage, wherein the voltage is coupled to a plate voltage." The memory cell may be a memory cell of memory array (e.g., memory array 120 of FIG. 1). Each memory cell may have a physical value (e.g., a polarization, a charge, etc.) corresponding to one or more stored logical values, and the memory cells may have two or more versions of the physical value (e.g., a first polar remnant and a second polar remnant) corresponding to the logical values. The physical values may be read (e.g., by a sense amplifier such as sense amplifier 122 of FIG. 1) by being converted into a voltage with a value corresponding to the stored logical value of the memory cell. The read voltages may be coupled to a plate voltage of a common plate (e.g., plate 126 of FIG. 1). The coupling may cause the read voltages to change when the plate voltage changes.

Block 1120 recites "Changing the plate voltage from a first voltage to a second voltage." The first and/or the second voltage may be limit voltages of the circuit, such as, for example, a power supply voltage VDD and a ground voltage. In some embodiments, the change may be a linear change where the voltage is decreased (or increased) at a constant rate until reaching the limit voltage. The plate may be coupled to a ramp control circuit (e.g., ramp control circuit 128 of FIG. 1) which controls the change in the plate voltage. The ramp control circuit may also determine when the value of the plate voltage should begin changing.

Block 1130 recites "Determining the logical value represented by the voltage based on a time when the voltage changes to a trigger voltage." The memory cells may have unknown logical values. The value of the voltage read from the memory cell may correspond to the logical value. The value of the voltage may be determined by tracking when the voltage reaches a trigger voltage. The trigger voltage may be a voltage level along an input line of a sense amplifier circuit at which an output voltage of the sense amplifier changes. For example, when the input voltage falls below the trigger voltage, the output voltage may change from a high value (e.g., VDD) to a low value (e.g., ground). The trigger voltage may be determined by properties of the sense amplifier, such as, for example, a trigger voltage of a hysteresis inverter (e.g., 342/442 of FIG. 3A-4B) of the circuit. Other circuit components may also contribute the value of the trigger voltage.

The method 1100 may also involve reading a known logical value from a reference memory cell. Similar to reading the voltage from the memory cells, the reference memory cell may be read as a reference voltage which corresponds to the known reference value. This reference voltage may also be coupled to the plate voltage that is also coupled to the memory cell voltages. The time at which the reference voltage reaches the limit voltage may be compared to the time at which the voltage from the memory cell reaches the limit voltage. The comparing may involve setting a cutoff time based on the time when the reference voltage reaches the limit voltage. The logical value of the memory cell may be determined based on this comparing. If the voltage from the memory cell reaches the limit voltage at or before the cutoff time, it may be determined to have the same logical value as the known logical value of the reference voltage. If the voltage from the memory cell has not reached the limit at the cutoff time, it may be determined to have an opposite logical value as the known logical value of the reference voltage.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory cell coupled to a plate, wherein as part of a read operation a voltage of the plate is changed from a first voltage to a second voltage;
a sense amplifier comprising a hysteresis inverter, the sense amplifier configured to read a digit line voltage from the memory cell, monitor a change in the digit line voltage as the plate changes from the first voltage to the second voltage, and determine a logical value of the memory cell based on a time when the digit line voltage crosses a threshold voltage of the hysteresis inverter.

2. The apparatus of claim 1, wherein the sense amplifier is further configured to provide an output voltage based on the determined logical value.

3. The apparatus of claim 2, wherein the memory cell comprises either a first logical value or a second logical value, which are read as a first voltage or a second voltage respectively, wherein there is a cell difference between the first and second voltages, and wherein the output voltage comprises either a third voltage or a fourth voltage corresponding to the first and second logical values respectively, wherein there is an output difference between the third and fourth voltages, and wherein the output difference is larger than the cell difference.

4. The apparatus of claim 2, further comprising a latch circuit coupled to the sense amplifier and configured to latch the output voltage.

5. The apparatus of claim 1, further comprising a reference amplifier comprising a second hysteresis inverter, the reference amplifier configured to read a reference voltage corresponding to a known logical value, monitor a change in the reference voltage as the plate voltage changes, and determine a cutoff time based on the time the reference voltage activates the second hysteresis inverter.

6. The apparatus of claim 5, wherein the logical value of the memory cell is determined by determining if the time when the digit line voltage crosses the threshold voltage is before or after the cutoff time.

7. The apparatus of claim 1, wherein the sense amplifier comprises a digit equalization switch selectively activated by a command signal to initialize an input voltage of the hysteresis inverter to a limit voltage.

* * * * *